United States Patent
von Ammon

(10) Patent No.: US 8,221,550 B2
(45) Date of Patent: Jul. 17, 2012

(54) PROCESS AND APPARATUS FOR PRODUCING A SINGLE CRYSTAL OF SEMICONDUCTOR MATERIAL

(75) Inventor: Wilfried von Ammon, Hochburg/Ach (AT)

(73) Assignee: Siltronic AG, Munich (DE)

(*) Notice: Subject to any disclaimer, the term of this patent is extended or adjusted under 35 U.S.C. 154(b) by 0 days.

(21) Appl. No.: 12/640,755

(22) Filed: Dec. 17, 2009

(65) Prior Publication Data

US 2010/0158783 A1   Jun. 24, 2010

Related U.S. Application Data

(60) Division of application No. 12/242,080, filed on Sep. 30, 2008, now Pat. No. 7,655,089, which is a continuation of application No. 10/350,570, filed on Jan. 24, 2003, now abandoned.

(51) Int. Cl.
   *C30B 35/00* (2006.01)

(52) U.S. Cl. ........ 117/214; 117/200; 117/208; 117/213; 117/217; 117/33

(58) Field of Classification Search ............... 117/200, 117/208, 213, 214, 217, 33
   See application file for complete search history.

(56) References Cited

U.S. PATENT DOCUMENTS

| | | | |
|---|---|---|---|
| 4,282,184 A | | 8/1981 | Feigl et al. |
| 5,034,200 A | | 7/1991 | Yamashita et al. |
| 5,080,873 A | | 1/1992 | Ono et al. |
| 5,089,082 A | | 2/1992 | Dreier et al. |
| 5,108,720 A | * | 4/1992 | Bourbina et al. ............ 117/12 |
| 5,211,802 A | * | 5/1993 | Kaneko et al. ............ 117/51 |
| 5,367,981 A | * | 11/1994 | Maruyama ............ 117/200 |
| 5,454,424 A | | 10/1995 | Mori et al. |
| 5,871,581 A | | 2/1999 | Atami et al. |
| 6,180,872 B1 | | 1/2001 | Fukuda et al. |
| 6,361,597 B1 | | 3/2002 | Takase et al. |
| 6,423,137 B1 | * | 7/2002 | Takase ............ 117/214 |
| 6,843,847 B1 | | 1/2005 | Lida et al. |

FOREIGN PATENT DOCUMENTS

| | | |
|---|---|---|
| DE | 195 38 020 A1 | 4/1997 |
| DE | 197 00 516 A1 | 7/1997 |
| EP | 0942077 A1 | 9/1999 |
| EP | 0 822 273 B1 | 10/2001 |
| JP | 011 22988 A | 5/1989 |
| JP | 11 180798 A | 4/1997 |
| JP | 09 142988 A | 6/1997 |
| JP | 11 292682 A | 10/1999 |

(Continued)

OTHER PUBLICATIONS

English Abstract corresponding to DE 195 38 020.

(Continued)

*Primary Examiner* — Matthew Song
(74) *Attorney, Agent, or Firm* — Brooks Kushman P.C.

(57) ABSTRACT

A process for producing a single crystal of semiconductor material, in which fractions of a melt, are kept in liquid form by a pulling coil, solidify on a seed crystal to form the growing single crystal, and granules are melted in order to maintain the growth of the single crystal. The melting granules are passed to the melt after a delay. There is also an apparatus which Is suitable for carrying out the process and has a device which delays mixing of the molten granules and of the melt.

10 Claims, 5 Drawing Sheets

| | FOREIGN PATENT DOCUMENTS | |
|---|---|---|
| JP | 2001-146498 | 5/2001 |
| WO | 99 46433 A1 | 9/1999 |
| WO | WO 9946432 A1 * | 9/1999 |
| WO | WO 9946433 A1 * | 9/1999 |

OTHER PUBLICATIONS

English Abstract corresponding to JP 09-142988.
English Abstract corresponding to JP 011 22988.

* cited by examiner

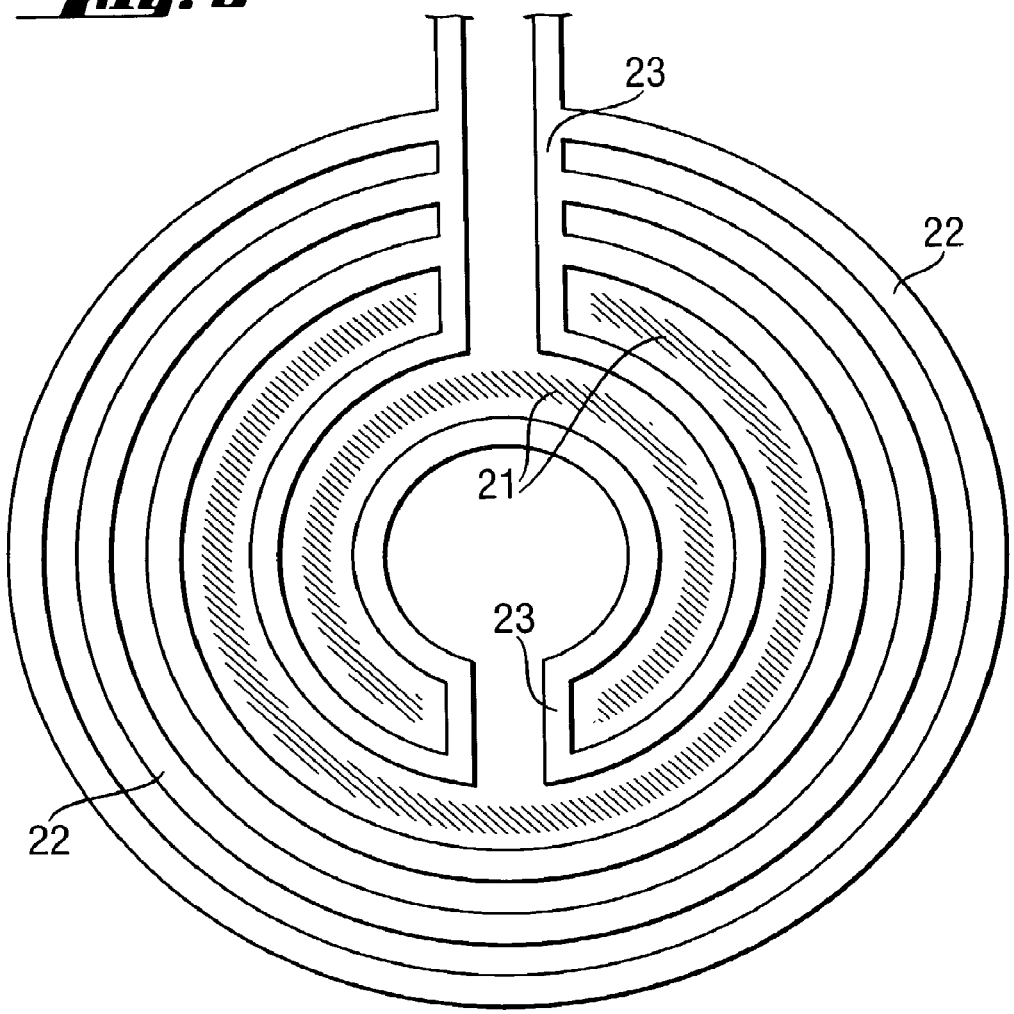

PROCESS AND APPARATUS FOR PRODUCING A SINGLE CRYSTAL OF SEMICONDUCTOR MATERIAL

CROSS-REFERENCE TO RELATED APPLICATIONS

This application is a divisional of U.S. application Ser. No. 12/242,080 filed Sep. 30, 2008, now U.S. Pat. No. 7,655,089, issued Feb. 2, 2010, which is a continuation of U.S. application Ser. No. 10/350,570, filed Jan. 24, 2003, (now abandoned), which claims foreign priority benefits under 35 U.S.C. §119(a)-(d) to German Application No. 102 04 178.4, filed Feb. 1, 2002. The entire disclosures of each of these patents applications are hereby incorporated by reference.

BACKGROUND OF THE INVENTION

1. Field of the Invention

The present invention relates to a process for producing a single crystal of semiconductor material by means of a method which differs from the known zone pulling (Fz process) substantially because polycrystalline granules, instead of a polycrystalline stock ingot, supply the material for the growth of the single crystal. The present invention also relates to an apparatus which is suitable for the production of the single crystal.

2. The Prior Art

A process of the same general nature is already known from DE 19538020 A1. The granules are melted in a vessel and fed to a melt which is located on the growing single crystal. The growth of the single crystal is maintained by an equilibrium between molten granules fed to the melt and solidifying fractions of the melt.

SUMMARY OF THE INVENTION

It is an object of the present invention to make it possible to produce dislocation-free single crystals, in particular with diameters of 200 mm and above.

The above object is achieved by the present invention which provides a process for producing a single crystal of semiconductor material, in which fractions of a melt, which is kept in liquid form by a pulling coil, solidify on a seed crystal to form the growing single crystal, and granules are melted in order to maintain the growth of the single crystal, wherein the melting granules are passed to the melt after a delay.

The present invention also provides an apparatus for producing a single crystal, comprising a vessel which is arranged above the growing single crystal and a conveyor device for feeding granules into the vessel, and a melting coil for melting the granules, and a pulling coil for maintaining a melt on the growing single crystal, the melting granules passing through openings in the vessel and the pulling coil to the melt, so as to form a melt neck, and solidifying fractions of the melt maintaining the growth of the single crystal, wherein the vessel has a device which delays mixing of the molten granules with the melt.

The process of the invention makes it possible to produce single crystals with the characteristics of zone-pulled material at costs which are well below the costs of Fz material. The polycrystalline granules which supply the raw material for the crystal growth are significantly less expensive than the polycrystalline stock ingots required for the Fz process. In addition, polycrystalline stock ingots are rarely available in a quality and size which makes it possible to produce single crystals with diameters of 200 mm and above. Yet even if this were possible, the process for pulling single crystals with such diameters can only be controlled with difficulty. This is on account of the masses which have to be simultaneously melted and crystallized. The consequence is low yields of dislocation-free single crystals, which are not economically competitive.

Although the process described in the abovementioned DE 19538020 A1 avoids the problems presented by the production and use of polycrystalline stock ingots, it is unsuitable for the production of dislocation-free single crystals. This is because of the particles which originate from the granules. These particles can all too easily reach the interface between the melt and the growing single crystal and end the dislocation-free growth of the single crystal.

This situation is where the present invention achieves these unexpected results by providing that the supply of the granules to the melt be delayed in its movement to the melt. As a result and as far as possible granules can only reach the melt when they have been completely melted. For this purpose, measures are taken to extend the distance over which the melting granules have to travel in order to reach the melt and/or to provide a barrier to these granules which have not yet completely melted. The melting granules preferably have to cover a distance of at least 25 mm, particularly preferably 50 mm, before reaching the melt. Furthermore, the invention is distinguished by the fact that measures which effectively avoid uncontrolled inclusion of oxygen in the single crystal are also provided. On the other hand, controlled amounts of oxygen can be fed to the melt via the growing single crystal, for example by positioning a ring of $SiO_2$ on the melt. A suitable ring is described, for example, in U.S. Pat. No. 5,089,082.

High-frequency coils are in each case used to melt the granules and to pull the single crystal. It is particularly advantageous if the pulling coil and the melting coil are inductively decoupled. This means that the energy provided by the pulling coil is used to control the growth of the single crystal but not to melt the granules. Decoupling of this nature can be achieved simply by leaving sufficient distance between the pulling coil and the base of the vessel to which the granules are fed.

At the start of the process, a melt is produced on a seed crystal in a similar manner to that which is also customary in the Fz process. The volume of the melt, which initially only comprises a molten drop, is increased as a result of the melting of the semiconductor material. In parallel, fractions of the melt are made to solidify, so as to form a growing single crystal, by slowly increasing the distance between the pulling coil and the seed crystal with rotation. In a first phase, the single crystal is allowed to grow into a cone. Later, the diameter of the single crystal is kept constant, with the result that most of the single crystal acquires a cylindrical appearance. The semiconductor material which is required for the production of single crystals with diameters of 200 mm and above, in particular during the pulling of the cylindrical section, is supplied substantially by polycrystalline granules which are melted with the aid of the melting coil. The melting granules are fed to the melt with a delay. To keep particles away from the growing single crystal, it is preferably ensured that the space around the vessel is separated in a dustproof manner from the space around the growing single crystal. In addition to structural measures which promote such separation, it is desirable for a gas stream, consisting, for example, of inert gas, such as argon, to be fed from the bottom upward through the pulling coil during the production of the single crystal.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

The invention is described in more detail below on the basis of figures. Identical features are provided with identical reference numerals.

FIG. 5 shows a plan view of a melting coil which is particularly suitable for use in an arrangement as shown in FIG. 4. In the further explanations of the invention, silicon is mentioned as a particularly preferred semiconductor material.

DETAILED DESCRIPTION OF PREFERRED EMBODIMENTS

Figure 1:
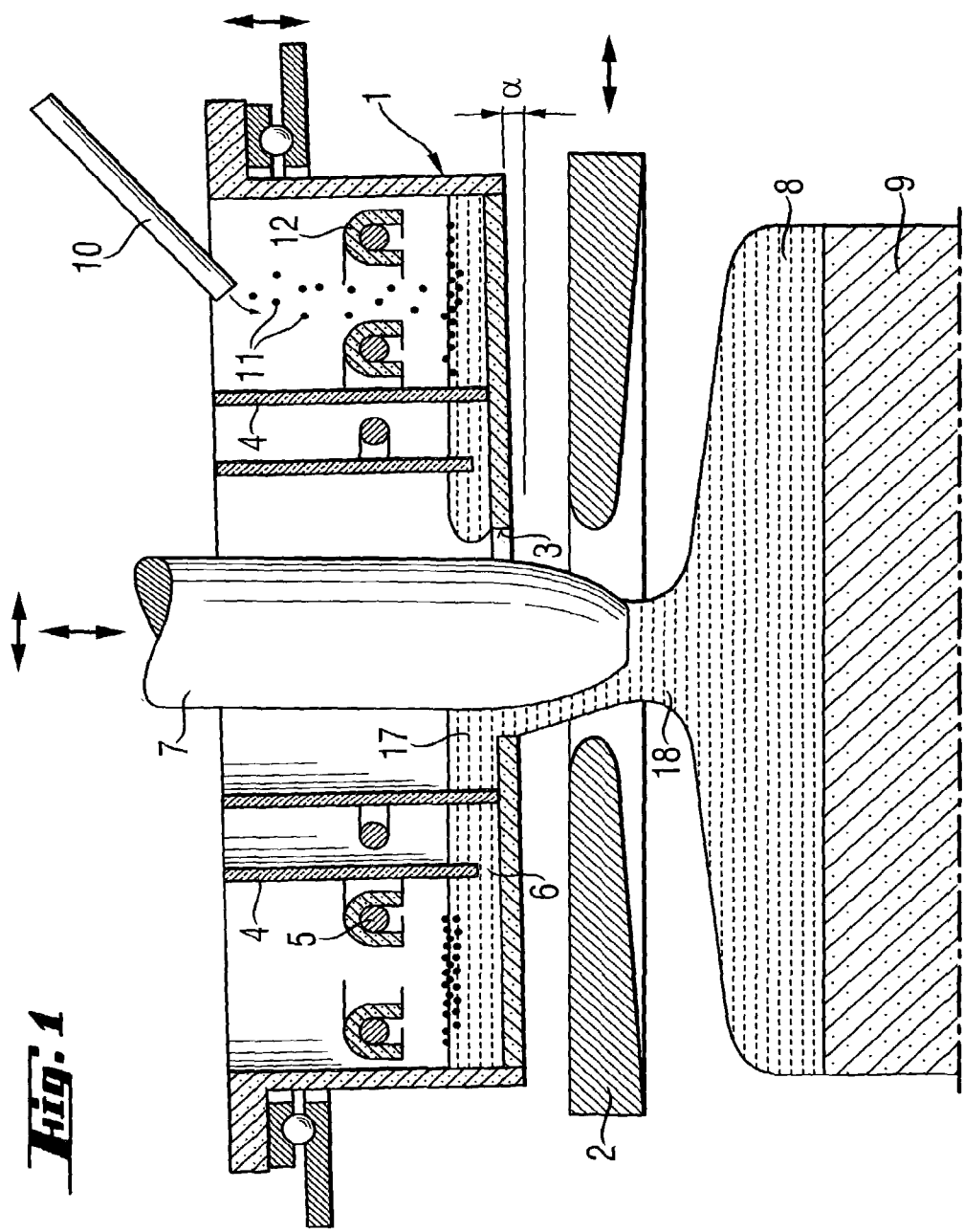
FIGS. 1 to 4 show preferred embodiments of the apparatus according to the invention.

In the apparatus shown in FIG. 1, there is a pot-like vessel 1, which can rotate and can be displaced in the axial direction, positioned above a pulling coil 2. The vessel consists of $SiO_2$, for example quartz, and, like the pulling coil, has a circular opening 3 in the center. Its interior is divided into a plurality of, preferably at least three, regions, which form a system of passages, by concentric quartz walls 4. The individual regions are connected to one another by openings 6 in such a way that the distance from the outer region to the central opening 3 is as long as possible and, for example, is in meandering form. In the regions there are individual or a plurality of parallel-connected turns of a high-frequency coil which is used to melt the granules and therefore serves as melting coil 5. In the outer region, to which the granules 11 are fed, the coil turns are covered with covers 12 made from quartz in order to avoid contact between the granules and the metallic surface of the melting coil. In the outer region, the quartz walls 4 are designed in such a way that the granules 11 supplied via a conveying device 10 cannot be scattered into the inner regions.

An ingot 7 of silicon, at which the molten silicon can run down through the inner hole in the pulling coil 2, to form a melt neck 18, to the melt 8 on top of the growing single crystal 9, projects into the central opening 3 in the vessel. The ingot can rotate and can be displaced in both the radial and axial directions. The axis of rotation of the vessel 1 is tilted through a small angle a, thus ensuring that the ingot is always wetted at the same place relative to the pulling coil 2. Radial displacement of the pulling coil makes it possible to control the way in which molten material runs out of a pool of melt 17 in the vessel 1 to the melt 8.

To prevent dust particles from being able to reach the melt 8, the space in which the single crystal is pulled should as far as possible be separated in a dustproof manner from the space in which the vessel is located. It is therefore preferable for the sickle-shaped gap between the ingot 7 and the edge of the central opening 3 in the vessel to be as narrow as possible, and for a gas stream to be directed upward through the gap, making it difficult for dust to penetrate into the pulling space.

Production of a single crystal begins by first of all melting a small quantity of silicon in the vessel 1 to form the pool of melt 17 and keeping it in liquid form. In this phase, the ingot 7 is not yet in contact with the pool of melt 17 which has been produced. Then, the ingot is moved downward through the central opening 3 in the vessel and the inner hole in the pulling coil. The seed pulling is commenced in a known way as a result of a molten droplet being produced on the lower tip of the ingot with the aid of the pulling coil 2 and a seed crystal being attached to this molten droplet. At this time, the ingot still has the function of the stock ingot used in the Fz process. First of all, as a result of the ingot being melted further and as a result of the lowering of the seed crystal commencing, a starting cone in single crystal form with a melt of sufficient volume resting on it is produced. Then, the ingot, together with the pulling coil, is displaced synchronously in such a way that the material which has been melted in the vessel to form the pool of melt 17 comes into contact with the ingot and as a result liquid silicon can move along the ingot to form a melt neck 18 and, from there, to the melt 8 on the growing single crystal 9. As the process continues, granules 11 are fed to the vessel according to demand and are melted. The growth of the single crystal is now substantially maintained by molten granules.

The extent of the axial displacement of the vessel 1 relative to the melting coil 5 regulates the extent to which the HF field of this coil is introduced into the molten granules. The melting characteristics of the granules can be influenced in this way and also by the choice of the HF power. Displacement of the vessel relative to the pulling coil may also be advantageous for the control characteristics. If the distance from the pulling coil becomes great, energy is no longer introduced into the pool 17 of molten granules from below, and silicon freezes at the bottom of the vessel. If the shape of the pulling coil is additionally modified in such a way that an upward bulge is formed integrally on the wetting side where the pulling coil adjoins the ingot which has been wetted with liquid silicon, at this location the locally higher introduction of energy means that no silicon freezes on the base of the vessel. Therefore, the molten granules can continue to run down to the melt undisturbed, while at the same time the direct contact surface between the molten granules and the base of the vessel consisting of $SiO_2$ is minimized by the layer of frozen silicon. This makes it possible to considerably reduce the introduction of oxygen into the melt and the formation of SiO.

Figure 2:
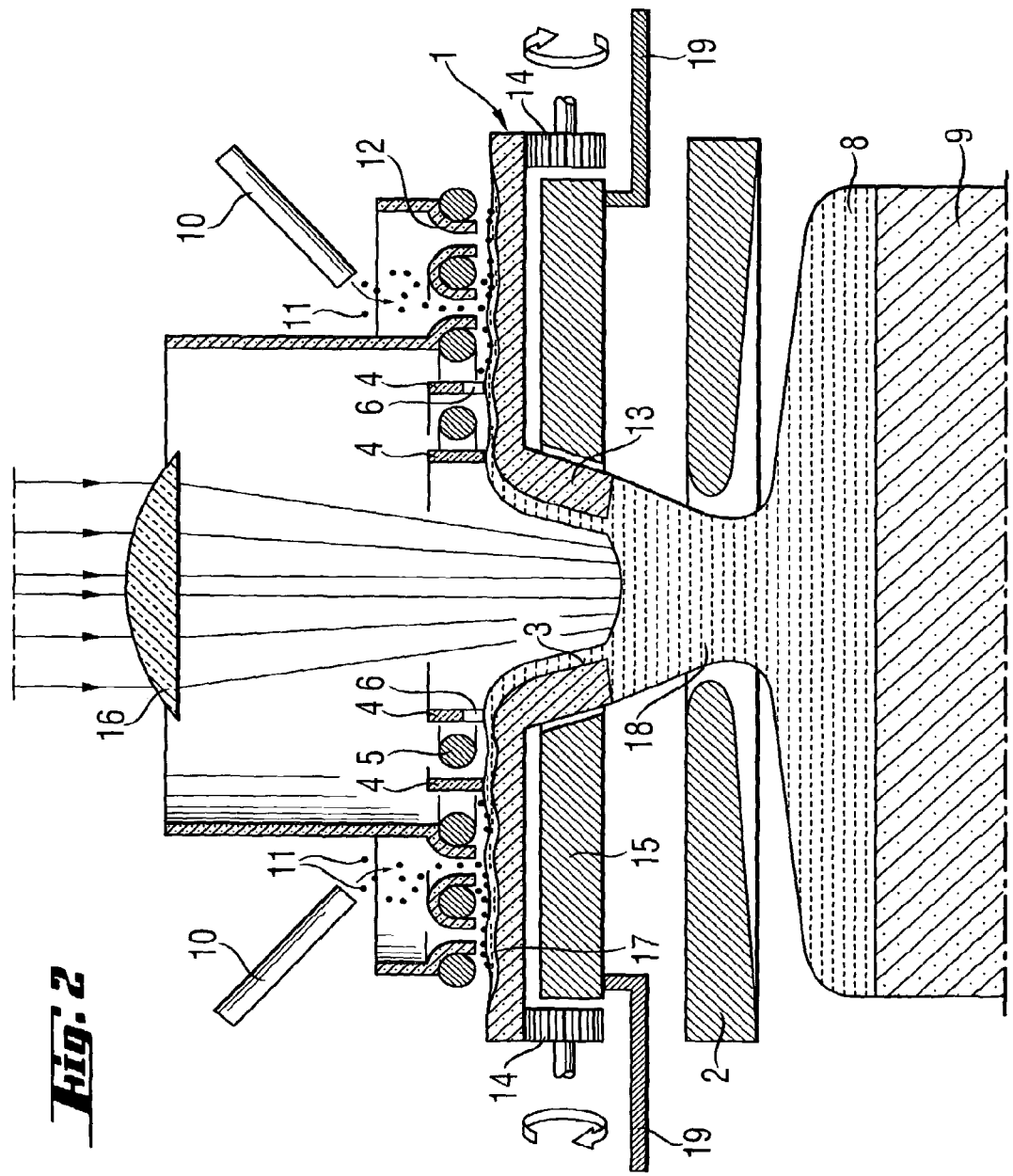

In the embodiment shown in FIG. 2, the vessel 1 comprises a plate of silicon which in the center has a tubular opening 3 which is created by a section of pipe 13 which is drawn downward. The plate is mounted rotatably, preferably on three wheels 14 which support the plate at the edge and also serve as a rotary drive. The plate 1 and the integrally molded section of pipe 13 are protected against direct introduction of the HF field of the pulling coil 2 from below and from the side by a cooling device 15. Device 15 can be for example a water-cooled metal plate, so that melting of the lower side of the plate 1 and of the outer side of the section of pipe 13 by the pulling coil is prevented. Moreover, the metal plate acts as a heat sink which dissipates the heat generated by the melting coil 5 in the plate. The melting coil is arranged above the plate. The central opening 3 in the plate and the inner side of the integrally molded section of pipe 13 are heated by an additional energy source, for example a radiation heating means, which is illustrated as a lens 16 for the purposes of simplification, in order to prevent freezing of the molten granules flowing to the melt 8 and of the melt neck 18 which forms. The thermal gradient which builds up in the plate and the integrally formed section of pipe 13 ensures that a stable pool of melt 17 is formed on the top side of the plate and the inner side of the section of pipe 13 remains in liquid form, while the base of the plate and the outer side of the integrally formed section of pipe 13 remain in solid form. The section of pipe 13 is completely closed off at the bottom by liquid silicon of the melt neck 18. Concentric quartz rings 4, which, as in the embodiment shown in FIG. 1, define regions which are connected to one another by openings 6 in such a way that a meandering path is formed, which the molten granules have to overcome before they can reach the melt 8, project into the pool of melt 17 which is formed by partial melting of the upper side of the plate and by melting of the granules. The feed device 10 and the covers 12 have the same functions as in the embodiment shown in FIG. 1. In addition, the innermost cover, by means of a suitable structural design, is now responsible for preventing supplied granules from passing directly into the inner region of the plate.

The embodiment shown in FIG. 2 has the advantage that the surface area of contact with quartz and therefore the introduction of oxygen into the pool of melt 17 and, finally, into the melt 8 is reduced further, and that the melting of the granules 11 and the pulling of the single crystal are completely electromagnetically decoupled. As a result, the pulling coil 2 can be optimized purely with a view to the pulling operation. Control also becomes more stable. Furthermore, the inner molten surface of the melt neck 18 at the end of the section of pipe 13 acts as a barrier to individual granules which have not yet completely melted, since they float on the surface until they have melted. It is virtually impossible for such particles to reach the growth front of the single crystal and cause dislocations in the crystal lattice. A further advantage is that the space holding the growing single crystal 9 can be very successfully sealed in a dustproof manner from the space holding the plate 1, since the two spaces are only connected by a narrow annular gap between the metal plate 15 and the plate 1. The dustproof separation of the spaces can be improved even further by a protective shield 19.

The production of a single crystal begins by first of all melting a closure at the lower end of the section of pipe 13 and by a seed crystal being fitted and pulled into a cone in the manner which has already been described. The closure used may be a piece of silicon which has been inserted into the section of pipe or the melt neck which solidified after the pulling of a previously produced single crystal. In this respect, the closure takes over the function of the ingot 7 shown in FIG. 1. At the same time or subsequently, the upper sides of the plate 1 and the closure of the tubular central opening are melted with the aid of the melting coil 5 and the radiation heating means 16, and further molten material is fed to the growing single crystal. Then, as the demand for molten material increases, additional granules are supplied, so that a stable pool of melt 17 is formed on the upper side of the plate, from which there is a continuous, controllable flow of molten material to the melt 8 on the growing single crystal.

Figure 3:
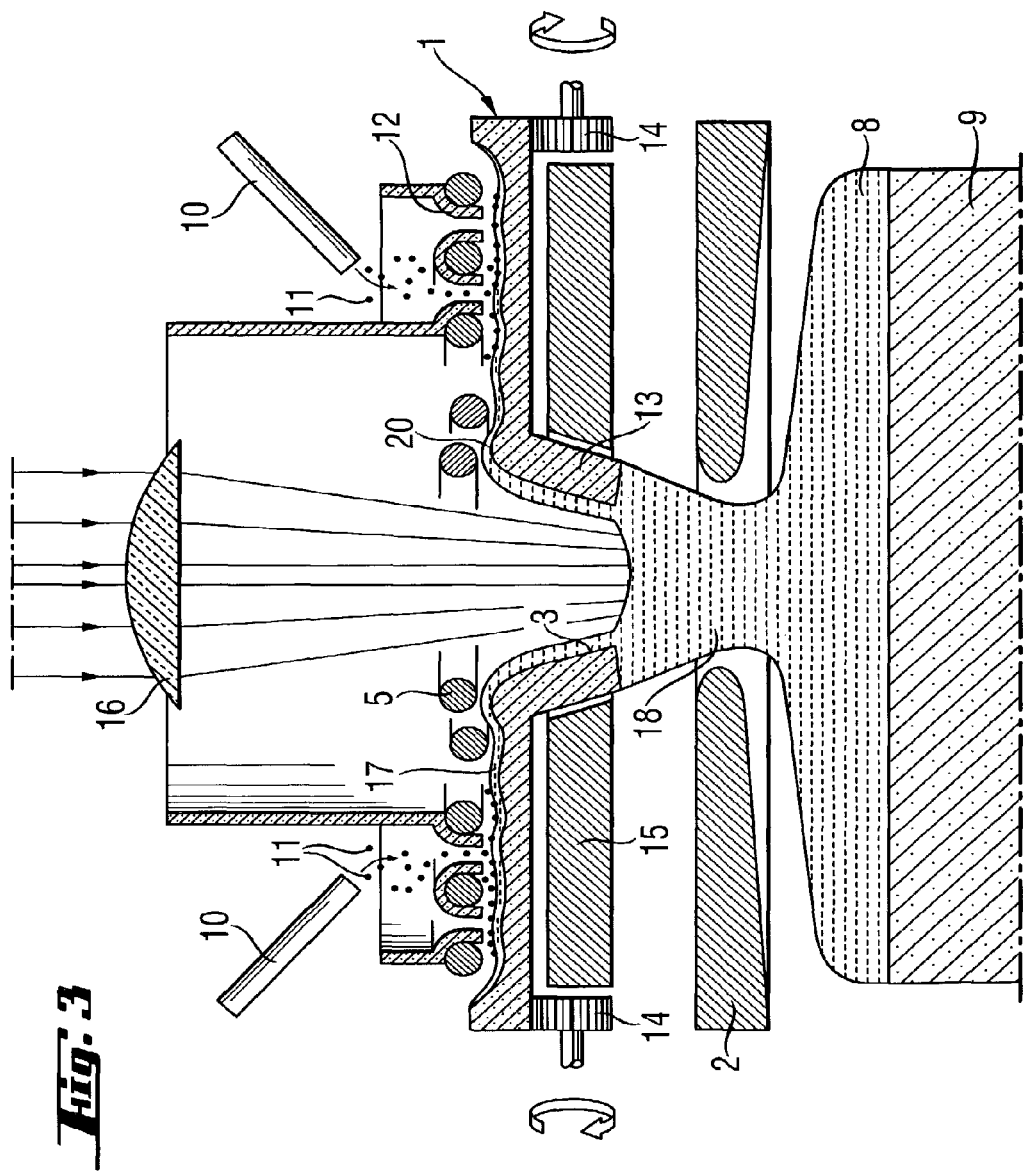

In the embodiment shown in FIG. 3, which is similar to the apparatus, shown in FIG. 2, quartz walls which are in contact with the pool of melt are completely dispensed with, so that there is no oxygen doping of the single crystal or formation of SiO. Instead, the melting coil 5, in the region above the edge of the tubular opening, is designed in such a way that at that location an increase in height 20 is produced on the surface of the plate 1, forming a barrier. If the melting coil is moved closer to the pool of melt or the HF power is increased, molten material is displaced by the repelling electromagnetic force and flows over the barrier into the tubular opening 3. If the barrier is sufficiently high, granules which have not yet completely melted are unable to overcome the barrier, on account of the force of gravity. Therefore, the barrier acts as a filter which blocks solid semiconductor material. Of course, the melting coil may be designed in such a way that a plurality of barriers in series are formed on the plate.

A single crystal is produced in a similar manner to the procedure which has already been described in connection with the embodiment shown in FIG. 2.

Figure 4:
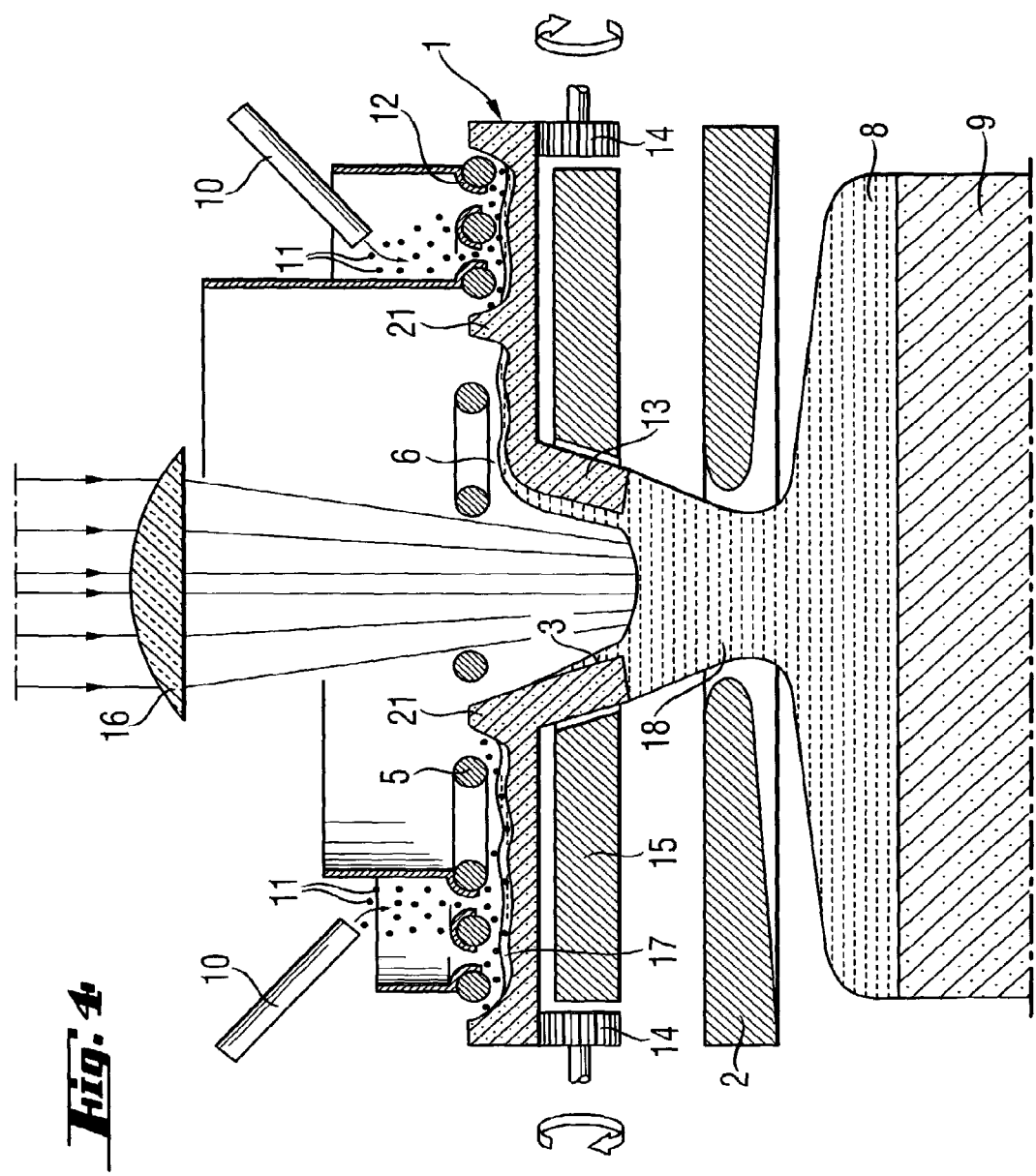

In the embodiment shown in FIG. 4, the concentric quartz walls of the apparatus shown in FIG. 2 have been replaced by solid webs 21 of silicon which project from the surface of the plate 1. The individual turns of the melting coil 5 are pulled relatively far apart on the inner side, so that between the turns the plate is not melted and webs remain in place. Where the turns of the melting coil are brought together by connecting pieces; however, the webs are melted. Thus openings 6 open up a meandering path between the regions which are separated by webs, and the melting granules 11 have to overcome this path in order to reach the melt 8 on the growing single crystal 9. If the plate is rotated slowly, a web melts as soon as it passes into the region of influence of a connecting piece. At the same time, the web is built up again at locations where molten material leaves the region of influence of the connecting piece. In this case, the molten material which is situated on the plate between the separated turns of the melting coil bulges upward on account of the relatively weak electromagnetic force active there, and ultimately solidifies again.

A suitably shaped melting coil is illustrated in FIG. 5. It has a plurality of concentric turns 22, the distances between the turns on the inner side being greater than the distances between the turns on the outer side. The turns are connected to one another by connecting pieces 23. The hatched areas between the turns which lie further apart indicate the presence of webs 21.

The use of an apparatus shown in FIG. 4 is particularly preferred, since any contact between molten material and quartz parts is completely avoided and it is possible to produce a long, meandering path which reliably prevents granules which have not yet completely melted from being introduced into the melt 8 on the growing single crystal. If the melting coil is divided into a coil for the outer region, into which granules are introduced, and a coil for forming the meandering path, the current of molten material can be controlled independently of the melting of the granules. This is advantageous in particular in the difficult pulling phase of building up the cone.

A single crystal is produced in a similar manner to the procedure which has already been described in connection with the embodiment shown in FIG. 2.

Silicon single crystals which have been produced using the process of the invention make it possible to produce semiconductor wafers with particularly advantageous defect properties. The grown-in defects are smaller than 60 nm even at oxygen concentrations of $3-9*10^{17}$ $cm^{-3}$, preferably $4-8.5*10^{17}$ $cm^{-3}$, and particularly preferably $4.5-8*10^{17}$ $cm^{-3}$, and are therefore easy to eliminate by heat treatment at least in the regions where they could adversely affect electronic components. Furthermore, to further reduce the size of the defects and to excite oxygen precipitation, it is advantageous for the single crystals to be additionally doped with nitrogen. A nitrogen concentration of $1*10^{13}-6*10^{15}$, preferably $1*10^{14}-4*10^{15}$, is expedient.

Accordingly, while a few embodiments of the present invention have been shown and described, it is to be understood that many changes and modifications may be made thereunto without departing from the spirit and scope of the invention as defined in the appended claims.

What is claimed is:

1. An apparatus for producing a single crystal, comprising
a vessel which is arranged above a growing single crystal, said vessel comprising a plate of silicon having a tubular opening at its center, said plate of silicon being cooled to prevent melting a lower side of the plate;
a conveyor device for feeding granules into the vessel;
a melting coil for melting the granules; and
a pulling coil for maintaining a melt on the growing single crystal;

melting granules passing through the tubular opening in the vessel and an opening in the pulling coil to the melt, so as to form a melt neck, and solidifying fractions of the melt maintaining growth of the single crystal; and said vessel having a device which delays mixing of molten granules and of the melt.

2. The apparatus as claimed in claim 1, further comprising a protective shield which separates a first space around the vessel in a dustproof manner from a second space around the growing single crystal.

3. The apparatus as claimed in claim 1, further comprising covers which are arranged above the melting coil and which the granules strike when they are fed into the vessel.

4. The apparatus as claimed in claim 1, further comprising a device for cooling the vessel.

5. The apparatus as claimed in claim 4, comprising a water-cooled metal plate which is separated from the vessel by a narrow gap, thus effecting radiant and convective cooling.

6. The apparatus as claimed in claim 1, comprising means for mounting the vessel so that it can rotate about an axis of rotation, said vessel consists of quartz and has walls made from quartz which divide an interior of the vessel into concentric regions, these regions being in communication with one another and forming a system of passages which the melting granules have to overcome before they can pass between the tubular opening in the vessel and an ingot of semiconductor material which projects through the tubular opening to reach the melt.

7. The apparatus as claimed in claim 6, wherein the axis of rotation of the vessel is tilted about an angle α.

8. The apparatus as claimed in claim 1, wherein the vessel has walls made from quartz which divide an interior of the vessel into concentric regions, these regions being in communication with one another and forming a system of passages which the melting granules have to overcome before they can pass through the tubular opening in the vessel, which is designed as a section of pipe, to the melt, and the apparatus further comprises a radiation heating means for heating a surface of the melt neck and granules flowing through the section of pipe.

9. The apparatus as claimed in claim 1, wherein the plate of silicon is delimited by an outer edge, and the tubular opening of the vessel is designed as a downwardly directed section of pipe which is connected to a raised inner edge of the plate, the inner edge of the plate forming a barrier which the molten granules have to overcome before they can pass through the tubular opening in the vessel to the melt, and the apparatus comprising a radiation heating means for heating a surface of the melt neck and the granules flowing through the section of pipe.

10. The apparatus as claimed in claim 9, comprising means for mounting the vessel so that it can rotate about an axis of rotation, and said vessel has webs which are constantly remelted under influence of the heating coil and the rotation of the vessel and divide an interior of the vessel into concentric regions, these regions being in communication with one another and forming a system of passages which the melting granules have to overcome before they can pass through the tubular opening in the vessel, which is designed as a section of pipe, to the melt, and the apparatus comprising a radiation heating means for heating a surface of the melt neck and granules flowing through the section of pipe.

* * * * *